United States Patent [19]

Siegwarth

[11] 4,287,510

[45] Sep. 1, 1981

[54] ELECTRONIC SIGNAL GENERATOR WITH PERIODICALLY VARYING FREQUENCY

[75] Inventor: Martin Siegwarth, Esslingen, Fed. Rep. of Germany

[73] Assignee: Richard Hirschmann Radiotechnisches Werk, Esslingen, Fed. Rep. of Germany

[21] Appl. No.: 99,894

[22] Filed: Dec. 3, 1979

[30] Foreign Application Priority Data

Dec. 2, 1978 [DE] Fed. Rep. of Germany ....... 2852196

[51] Int. Cl.$^3$ .............................................. G08B 3/00
[52] U.S. Cl. .............................. 340/384 E; 340/384 R
[58] Field of Search ...................... 340/384 R, 384 E; 368/245; 331/76, 178; 84/484

[56] References Cited

U.S. PATENT DOCUMENTS

3,759,029  9/1973  Komaki ................................ 368/245

Primary Examiner—Harold I. Pitts
Attorney, Agent, or Firm—Karl F. Ross

[57] ABSTRACT

An astable multivibrator with an R/C coupling network establishing a nominal operating frequency in the KHz range works into a chain of binary divider stages stepping down that frequency to the order of one Hz. The last stage output or outputs of the divider chain are connected to the coupling network through a feedback path including a switching transistor, driven into conduction during alternate half-cycles of the multivibrator, whereby the charging rate of the network capacitance is modified in slow steps with corresponding changes in operating frequency. Several intermediate stage outputs of the divider chain are tapped by way of a coincidence gate to energize a loudspeaker via an audio amplifier with a pulse train having a basic cadence of several hundred Hz, modulated by the feedback, and an on/off ratio well below 1:1.

12 Claims, 3 Drawing Figures

ELECTRONIC SIGNAL GENERATOR WITH PERIODICALLY VARYING FREQUENCY

FIELD OF THE INVENTION

My present invention relates to an electronic signal generator of periodically varying frequency, more particularly to an emitter of acoustic signals with periodic changes in pitch.

BACKGROUND OF THE INVENTION

Sound generators of this type are frequently used in alarm systems or on emergency vehicles, for example. They generally comprise a load in the form of an electro-acoustic transducer, such as a horn or siren, which is energized by the output of a main oscillator operating in the audio-frequency range whose tuning is electronically varied by the output of a ancillary oscillator of substantially lower frequency. The need for two separate oscillation generators makes the system cumbersome and relatively expensive, especially because of the large tuning capacitance required for the low-frequency oscillator. Moreover, the presence of these independently operating components increases the effect of unavoidable manufacturing tolerances upon the character of the resulting output signal, i.e. its periodicity, shape and harmonics content, so that nominally identical series-produced devices emit rather dissimilar acoustic signals.

OBJECTS OF THE INVENTION

An important object of my present invention, therefore, is to provide a signal generator of periodically variable frequency which is of simple construction and in which the effect of manufacturing tolerances upon the emitted signal is greatly minimized.

Another object, particularly applicable to a sound generator, is to provide means for optimizing the energization of an electro-acoustic transducer to insure the maximum admissible deflection of its diaphragm without wasteful expenditure of excess electrical energy.

SUMMARY OF THE INVENTION

In accordance with the present invention, I provide an oscillator with electronically adjustable tuning means for varying its operating frequency with the aid of a frequency divider connected to the oscillator and a feedback connection extending from an output terminal of the divider to the tuning means for periodically modifying the operating frequency in response to a control signal which is subharmonically related to that frequency. A useful signal, whose frequency is substantially higher than that of the control signal, is tapped off by means of a load circuit connected to the oscillator in parallel with at least part of the frequency divider.

In this way, one and the same oscillator generates a fundamental frequency and a substantially lower modulating frequency by which that fundamental frequency may be altered in steps or wobbled in a substantially continuous manner. There exists, accordingly, an invariable mathematical relationship between the normal oscillator frequency and the stepped-down modulating frequency whereby manufacturing tolerances have only a minor effect upon the character of the resulting signal.

Pursuant to a more particular feature of my invention, the oscillator is an astable multivibrator generating a square wave which is stepped down by a chain or cascade of binary divider stages; the latter may be simple C/MOS flip-flops readily available in integrated circuitry. With a sufficient number of such flip-flops, a multivibrator frequency in the KHz range can be converted into a modulating frequency on the order of 1 Hz (e.g. between 1 and 3 Hz); the useful signal, taken off at an intermediate stage output, may then have a basic frequency in the middle audio range, preferably between about 300 and 500 Hz. These frequency ranges have been found particularly effective in an acoustic alarm system.

While there are several ways in which the operating frequency of an astable multivibrator can be electronically modulated, including the use of voltage-controlled impedances such as varactors, I have found it especially advantageous to use a switching transistor through which the output terminal of the frequency divider communicates during alternate half-cycles of the multivibrator frequency with a capacitive branch forming part of an R/C coupling network connected across one of the inverter stages of the multivibrator. Depending upon the polarity of the switching transistor, which has input connections across a portion (preferably the resistive branch) of the coupling network, the charging rate of the capacitive branch is modified (preferably accelerated) by the control signal issuing from the divider. If the control signal is of stepped configuration, as by being derived from a final divider stage and one or more preceding divider stages through the intermediary of respective weighting resistors diminishing in magnitude toward that final stage, the emitted acoustic signal will progressively change in pitch and then return to its basic frequency during each modulating cycle. With a sufficient number of divider-stage outputs combined in this manner, the pitch change will be perceived as continuous rather than stepwise.

Still another feature of my invention resides in the provision of a coincidence (AND, NAND or NOR) gate having inputs connected to a plurality of divider-stage outputs for producing a pulse train with an on/off ratio less than 1:1 which I have found to be highly effective in energizing the deflecting coil of a dynamic loudspeaker for creating a maximum diaphragm stroke and thus sound amplitude with minimum expenditure of electrical energy. An on/off ratio of 1:7, realizable with a three-input coincidence gate, is especially desirable for this purpose.

BRIEF DESCRIPTION OF THE DRAWING

The above and other features of my present invention will now be described in detail with reference to the accompanying drawing in which.

SPECIFIC DESCRIPTION

Figure 1:
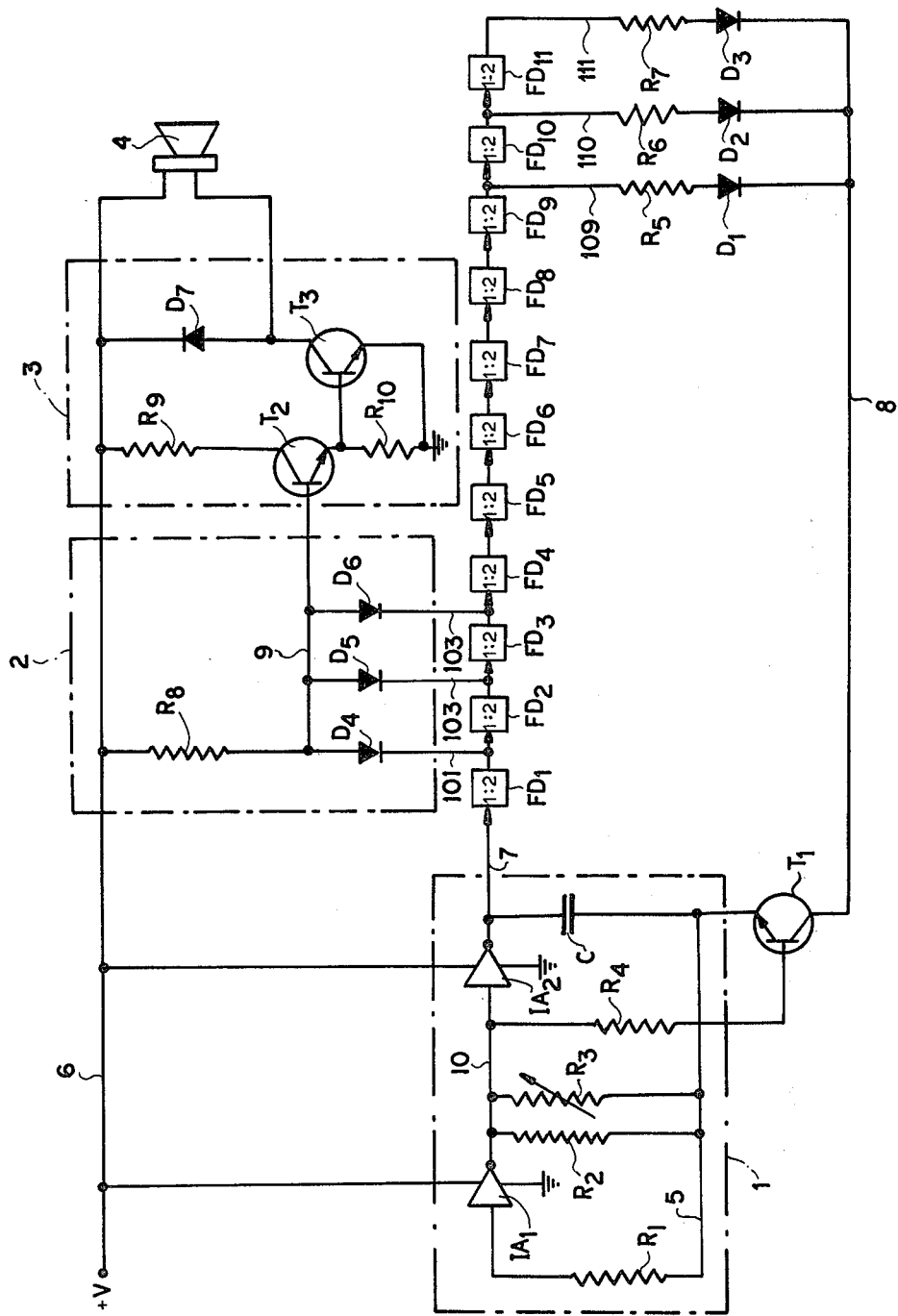
FIG. 1 is a circuit diagram of an electro-acoustic signal generator embodying my invention.

In FIG. 1 I have shown an oscillator 1 designed as an astable multivibrator with two inverting amplifier stages $IA_1$ and $IA_2$. The output of inverter stage $IA_1$ is connected directly through a lead 10 to the input of inverter stage $IA_2$ whose output is coupled to the input of stage $IA_1$ via a resistor $R_1$ and a capacitor C, the latter forming part of a resistance/capacitance network.

This R/C network further comprises a fixed resistor $R_2$, connected between the interstage lead 10 and the junction 5 of capacitor C with resistor $R_1$, and a manually adjustable calibrating resistor $R_3$ in parallel with resistor $R_2$. The two inverter stages $IA_1$, $IA_2$ are energized with positive voltage $+V$ via a bus bar 6 from a nonillustrated d-c source whose negative pole is grounded. Inverter $IA_2$ has an output lead 7.

The operation of the multivibrator 1, viewed apart from the other components of the system, is as follows:

When inverter $IA_1$ conducts in the presence of low voltage on connection 5, high voltage (positive) on connection 10 cuts off the inverter $IA_2$ whereby the potential of output lead 7 drops to substantially ground level. Capacitor C now charges through parallel resistors $R_2$ and $R_3$ until the potential of connection 5 becomes sufficiently positive to cut off the inverter $IA_1$ and turn on the inverter $IA_2$. A discharge current now flows from capacitor C through resistors $R_2$ and $R_3$ until connection 5 has again reached a low voltage causing conduction of inverter $IA_1$ and restarting the cycle. Thus, the length of a cycle and therefore the operating frequency of multivibrator 1 is determined by the time constant of the R/C network connected across inverter $IA_2$, that time constant being adjustable with the aid of calibrating resistor $R_3$. In this specific embodiment, multivibrator 1 is assumed to have an operating frequency of 3.072 KHz.

Output lead 7 extends to a cascade of eleven binary frequency-divider stages $FD_1$–$FD_{11}$, i.e. flip-flops preferably of the C/MOS type as noted above. Flip-flops $FD_1$, $FD_2$, $FD_3$, $FD_9$, $FD_{10}$ and $FD_{11}$ have respective stage outputs 101, 102, 103, 109, 110, 111 carrying nominal frequencies of 1536 Hz, 768 Hz, 384 Hz, 6 Hz, 3 Hz and 1.5 Hz. The output oscillations of the last three stages form a composite control signal fed back to multivibrator 1 via a common terminal, represented by a line 8, connected to the collector of an NPN transistor $T_1$ whose emitter is tied to junction 5 and whose base is connected by way of a resistor $R_4$ to the interstage lead 10. The feedback path includes respective weighting resistors $R_5$, $R_6$ and $R_7$ in series with diodes $D_1$, $D_2$ and $D_3$ in leads 109, 110 and 111. The magnitudes of these resistors diminish progressively from divider stage $FD_9$ to divider stage $FD_{11}$ in a ratio of about 4:2:1 which results in a reverse ratio of substantially 1:2:4 for the output currents $I_{109}$, $I_{110}$, $I_{111}$ of stages $FD_9$, $FD_{10}$, $FD_{11}$ flowing during conduction of transistor $T_1$; these output currents have been illustrated in FIG. 2. Transistor $T_1$ is switched on during those alternate half-cycles of multivibrator 1 in which connection 10 is more positive than connection 5, i.e. while charging current is flowing into capacitor C by way of resistors $R_2$ and $R_3$. This charging current is, accordingly, supplemented by the output current or currents of whichever of the three final divider stages $FD_9$, $FD_{10}$, $FD_{11}$ conducts at a given instant.

Figure 2:
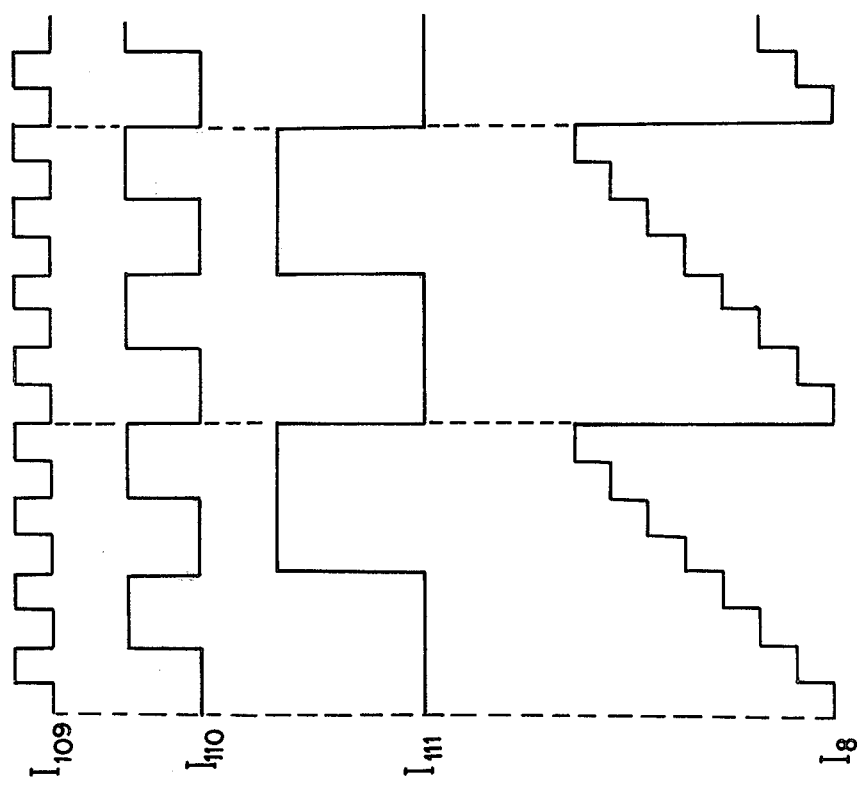
FIG. 2 is a set of graphs relating to the generation of a modulating signal by the circuitry of FIG. 1.

Thus, as illustrated in FIG. 2, the resulting feedback current or control signal $I_8$ on line 8 has a stepped configuration with a recurrence period equal to that of pulse train $I_{111}$ corresponding in the assumed instance to a repetition frequency or cadence of 1.5 Hz. The number of steps is equal to $2^n$ where n represents the number of divider stages (here three) participating in the feedback. If only the final stage $FD_{11}$ were involved, the feedback current would correspond to the square wave $I_{111}$ of FIG. 2 whereby the system would operate as a two-tone generator.

The accelerated charging of tuning capacitor C in alternate half-cycles of the multivibrator frequency progressively increases that frequency during the rising flank of the generally sawtooth-shaped control signal $I_8$ and then rapidly returns it to its nominal value. Though the steps of signal $I_8$ have been shown uniform in FIG. 2, this is not exactly true since the effect of the frequency increments is cumulative so that the rising sawtooth edge tends to approximate an exponential curve. This is not a disadvantage but, as tests have shown, enhances the attention-getting effect of the generated alarm signal.

The diodes $D_1$–$D_3$ protect the switching transistor $T_1$ against possible polarity inversions. This could also be accomplished by means of a single diode in lead 8, yet in that instance the weighting resistors $R_5$–$R_7$ would no longer be mutually isolated so that their magnitudes would have to be modified in order to generate the stepped control signal $I_8$ shown in FIG. 2.

The proportional magnitude of the frequency change introduced by the control signal, in terms of the nominal oscillator frequency, depends of course on the several circuit parameters determining the relative magnitudes of the normal charging current of capacitor C and the supplemental current passed by the switching transistor $T_1$.

An electro-acoustic transducer 4, such as a loudspeaker or horn, is energized by the signal on output lead 7 of multivibrator 1 through the intermediary of the first three divider stages $FD_1$–$FD_3$, an AND gate 2 and an audio-frequency amplifier 3. AND gate 2 comprises three diodes $D_4$, $D_5$, $D_6$ respectively inserted in stage outputs 101, 102, 103 and connected by way of a resistor $R_8$ to positive bus bar 6. The junction of diodes $D_4$–$D_6$ with resistor $R_8$ is formed by a lead 9 extending to the base of an NPN transistor $T_2$ representing the first stage of amplifier 3, the collector of this transistor being connected to bus bar 6 via a resistor $R_9$ while its emitter is grounded through a resistor $R_{10}$. The base of a second-stage NPN transistor $T_3$ is connected to the emitter of transistor $T_2$ while its emitter is grounded and its collector is connected to bus bar 6 through the operating coil (not shown) of transducer 4. A diode $D_7$ inserted in bucking relationship with transistor $T_3$ between its collector and bus bar 6 protects this transistor from reverse-voltage peaks developing in the transducer coil.

Figure 3:
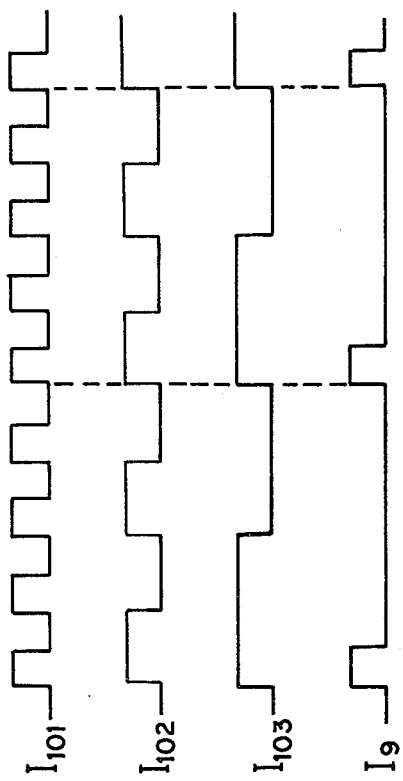
FIG. 3 is a set of graphs relating to the generation of a pulse train by that circuitry for the energization of a loudspeaker.

In FIG. 3 I have shown pulse trains $I_{101}$, $I_{102}$ and $I_{103}$ respectively appearing in the outputs of divider stages $FD_1$, $FD_2$ and $FD_3$. Whenever any of these pulse trains is at low level (ground), the corresponding diode conducts so that base lead 9 of transistor $T_2$ is rounded and amplifier 3 is cut off. When all three pulse trains are high, which occurs once in every fourth period of oscillation $I_{101}$, transistor $T_2$ is turned on by a pulse $I_9$ for half that period as illustrated in FIG. 3. Thus, the useful signal produced by amplifier 3 to drive the transducer 4 has an on/off ratio of 1:7 which—as noted above—lets the loudspeaker diaphragm oscillate at maximum amplitude without expenditure of excess electrical energy.

From FIGS. 2 and 3 it will be noted that flip-flops $FD_{10}$ and $FD_{11}$ are switched on the trailing edges whereas flip-flops $FD_2$ and $FD_3$ are switched on the leading edges of the output pulses of their immediate predecessor stages; the resulting phase shift between these two groups of flip-flops is of no significance. It will also be apparent that a pulse train of the same low duty ratio as signal $I_9$ could be generated if circuit 2 were designed as a NOR gate. Obviously, the duty ratio can be modified by using fewer or more divider-stage outputs working into such a coincidence gate.

If transistor $T_1$ were of the PNP type and diodes $D_1$–$D_3$ were reversed, the transistor would conduct during those half-cycles of the multivibrator frequency in which capacitor C discharges through resistors $R_2$ and $R_3$. A supplemental discharge current would then flow through the transistor and the diodes in series with weighting resistors $R_5$–$R_7$ when the corresponding divider-stage outputs 109–111 are at low potential. This would again foreshorten the multivibrator cycles so as to increase the oscillator frequency. It would also be possible to operate the transistor $T_1$ in such a way (as by connecting its base resistor $R_4$ to output lead 7) that the feedback current retards the charging or discharging of the capacitor to lengthen the cycle, yet this is less advantageous than the circuitry shown in FIG. 1. Naturally, the operation of the system would not be changed significantly if all the polarities were inverted and transistors $T_1$–$T_3$ were all of PNP type.

While the control signal $I_8$ in any event modifies only every other half-cycle of the oscillator frequency, the output signals of divider stages $FD_1$–$FD_{11}$ are all square waves with a 50% duty ratio. It is for this reason that I prefer to interpose at least the first divider stage $FD_1$ between the multivibrator 1 and the coincidence gate 2 which generates the useful signal driving the transducer 4.

I claim:

1. A signal generator comprising:
    an oscillator provided with electronically adjustable tuning means for varying the operating frequency thereof;
    frequency-dividing means connected to said oscillator for generating on an output terminal thereof a periodically varying control signal subharmonically related to said operating frequency;
    feedback means extending from said output terminal to said tuning means for periodically modifying said operating frequency in response to said control signal; and
    a load circuit connected to said oscillator in parallel with at least part of said frequency-dividing means for tapping off a useful signal whose frequency is substantially higher than that of said control signal.

2. A signal generator as defined in claim 1 wherein said oscillator is an astable multivibrator with a pair of inverter stages, said tuning means comprising a resistance/capacitance network connected across one of said inverter stages.

3. A signal generator as defined in claim 2 wherein said feedback means includes a switching transistor with input connections across a portion of said network for conducting during alternate half-cycles of said multivibrator.

4. A signal generator as defined in claim 3 wherein said switching transistor has an emitter connected to a junction of a capacitive branch with a resistive branch of said network, a base connected to another point of said resistive branch, and a collector joined to said output terminal.

5. A signal generator as defined in claim 4 wherein said resistive branch includes a fixed resistor and an adjustable calibrating resistor in parallel with each other.

6. A signal generator as defined in claim 4 or 5, further comprising at least one protective diode in series with said collector.

7. A signal generator as defined in claim 2 wherein said frequency-dividing means comprises a cascade of binary divider stages.

8. A signal generator as defined in claim 7 wherein said divider stages include a final stage and at least one preceding stage connected to said output terminal by way of respective weighting resistors, diminishing in magnitude from said preceding stage to said final stage, for imparting a stepped configuration to said control signal.

9. A signal generator as defined in claim 8, further comprising respective diodes in series with said weighting resistors.

10. A signal generator as defined in claim 7, 8 or 9 wherein said load circuit includes a coincidence gate with input connected to a plurality of stage outputs of said cascade for generating a pulse train with an on/off ratio less than 1:1.

11. A signal generator as defined in claim 10 wherein said pulse train has a recurrence frequency in the audio range, said load circuit further including a loudspeaker connected to an output of said coincidence gate, said control signal having a frequency on the order of one Hz.

12. A signal generator as defined in claim 1, 2, 3, 4, 7 or 8 wherein said load circuit includes an electro-acoustic transducer, said operating frequency being in the KHz range, said useful signal having a basic frequency between substantially 300 and 500 Hz, said control signal having a frequency on the order of one Hz.

* * * * *